United States Patent
Barth

(10) Patent No.: US 7,193,263 B2
(45) Date of Patent: Mar. 20, 2007

(54) ELECTRONIC COMPONENT HAVING AN INTEGRATED PASSIVE ELECTRONIC COMPONENT AND ASSOCIATED PRODUCTION METHOD

(75) Inventor: Hans-Joachim Barth, München (DE)

(73) Assignee: Infineon Technologies AG, Munich (DE)

( * ) Notice: Subject to any disclaimer, the term of this patent is extended or adjusted under 35 U.S.C. 154(b) by 80 days.

(21) Appl. No.: 11/109,405

(22) Filed: Apr. 19, 2005

(65) Prior Publication Data

US 2005/0199934 A1  Sep. 15, 2005

Related U.S. Application Data

(63) Continuation of application No. PCT/DE03/02987, filed on Sep. 9, 2003.

(30) Foreign Application Priority Data

Oct. 22, 2002 (DE) .............................. 102 49 192

(51) Int. Cl.
  *H01L 27/108* (2006.01)
  *H01L 29/76* (2006.01)
  *H01L 29/94* (2006.01)
  *H01L 31/119* (2006.01)

(52) U.S. Cl. ...................... 257/306; 257/307; 257/308; 257/309; 257/310

(58) Field of Classification Search ................ 257/295, 257/306–310, 532, 534, 535
See application file for complete search history.

(56) References Cited

U.S. PATENT DOCUMENTS 5,208,725 A * 5/1993 Akcasu ........................ 361/313

(Continued)

FOREIGN PATENT DOCUMENTS

DE   101 06 161 A1   2/2001

(Continued)

OTHER PUBLICATIONS

Roberto Aparicio, "Capacity Limits and Matching Properties of Integrated Capacitors" pp. 384-393, IEEE Journal of Solid-State Circuits, vol. 37, No. 3, Mar. 2002.

(Continued)

*Primary Examiner*—Thien F Tran
(74) *Attorney, Agent, or Firm*—Brinks Hofer Gilson & Lione

(57) ABSTRACT

An electronic component and method of production thereof is presented. The electronic component includes a first insulation layer, an upper metal layer on the first insulation layer, an electrically conductive structure integrated into the first insulation layer and formed as a capacitor with a first metal strip sequence, and a second metal strip sequence. Each of the first and second sequences are arranged congruently one above another and are connected to one another by via connections. The second sequence is arranged on both sides of the first sequence at identical lateral distances. The metal strips of the first and second sequences are arranged at the same level and are connected to different electrical potentials. The electrically conductive structure mechanically stabilizes the insulation layer under the action of mechanical force such as bonding of the upper metal layer or mounting of the electronic component.

27 Claims, 4 Drawing Sheets

U.S. PATENT DOCUMENTS

| | | |
|---|---|---|
| 5,583,359 A | 12/1996 | Ng et al. |
| 6,313,024 B1 | 11/2001 | Cave et al. |
| 6,387,754 B2 | 5/2002 | Dalton et al. |
| 2002/0072223 A1 | 6/2002 | Gilbert et al. |
| 2002/0123159 A1 | 9/2002 | Chi et al. |
| 2002/0142512 A1 | 10/2002 | Ma et al. |

FOREIGN PATENT DOCUMENTS

| | | |
|---|---|---|
| DE | 101 10 566 A1 | 3/2001 |
| EP | 0 973 198 A2 | 1/2000 |
| EP | 1 143 513 A1 | 10/2001 |

OTHER PUBLICATIONS

International Examination Report from corresponding PCT patent application No. PCT/DE03/02987.

International Search Report from corresponding PCT patent application No. PCT/DE03/02987.

* cited by examiner

ELECTRONIC COMPONENT HAVING AN INTEGRATED PASSIVE ELECTRONIC COMPONENT AND ASSOCIATED PRODUCTION METHOD

PRIORITY

This application is a continuation of International Application PCT/DE03/02987, filed on Sep. 9, 2003, which claims the benefit of priority to German Patent Application DE 102 49 192.5, filed on Oct. 22, 2002, both of which are herein incorporated by reference in their entirety.

TECHNICAL FIELD

This invention relates to an electronic component having an integrated electronic component and a method for producing this electronic component.

BACKGROUND

Most analog circuit sections of hybrid digital/analog circuits require passive components, for example capacitors with a high capacitance, a high degree of linearity and high quality. In order to minimize the costs of producing the component, it is desirable that the production of the passive components, in particular capacitance or inductance structures, use as few process steps as possible. Furthermore, the advancing miniaturization of the components and integrated circuits is also accompanied by the demand for the least possible area requirement for the integrated passive components.

U.S. Pat. No. 5,583,359 discloses a capacitance structure for an integrated circuit. In that case, a plurality of metal plates which form the electrodes of a stacked capacitor are arranged one above the other, separated by dielectric layers. Arranged in each plane of a metal plate is a metal line insulated from the respective plate. The metal lines are in each case contact-connected on both sides by via connections, as a result of which, on the one hand, all the plates positioned in odd-numbered fashion in the stack and, on the other hand, all the plates positioned in even-numbered fashion in the stack are electrically connected to one another. By connecting the plates positioned in even-numbered fashion to a first connection line and the plates positioned in odd-numbered fashion to a second connection line, adjacent plates are at a different potential and form pairwise in each case electrodes of a plate capacitor. The capacitance surface area is thus formed by the plate surfaces. An alternative embodiment of the electrodes is provided by forming the plates as strip-type lines arranged parallel to one another.

Further possible configurations of capacitance structures are disclosed in Aparicio, R. and Hajimiri, A.: Capacity Limits and Matching Properties of Integrated Capacitors; IEEE Journal of Solid-State Circuits, Vol. 37, No. 3, 2002, pp. 384–393, which are shown in perspective illustration in FIGS. 5 to 10.

Furthermore, in novel chips in which dielectric regions are formed whose materials have low dielectric constants (for example SiLK, organic material having a dielectric constant of 2.65), black diamond, coral (both carbon-doped oxides having a dielectric constant of less than 3) or porous formations of these dielectrics), mechanical reinforcements are formed in order to avoid damage on account of the low hardness of these dielectric materials under the action of mechanical force on the component.

Components in which both passive components and mechanical supporting structures are present therefore use a relatively large amount of space. What is more, the mechanical supporting structure is no longer used after the completion of the component, in particular after bonding and mounting of the component in the housing.

BRIEF SUMMARY

It is desirable to provide an electronic component having an integrated passive electronic component and a method for producing it which can be produced with a relatively low outlay and in a space-saving manner and is robust towards any action of mechanical force.

By way of introduction only, in one aspect, an electronic component comprises a first insulation layer on which an upper metal layer is formed. The upper metal layer is formed as an electrically conductive bonding pad layer to which are bonded aluminum or gold wires electrically connecting the contact regions of the electronic component or the chip to the contact tracks of a housing in which the electronic component is mounted. An electrically conductive structure is integrated in the first insulation layer and mechanically stabilizes the first insulation layer under the action of mechanical force, for example during the bonding of the upper metal layer and/or the mounting of the electronic component. The electrically conductive structure is additionally formed as a passive electronic component.

As a result, it is possible to produce an electronic component which needs a relatively low space requirement and can be realized with a relatively low outlay. The electrically conductive structure in the electronic component serves, on the one hand, as a mechanical supporting structure under the action of mechanical force on the component, in particular as a mechanical supporting structure for the first insulation layer, and, on the other hand, as a passive component of the electronic component. This individual structure with a dual function reduces the process steps during production and thus the manufacturing costs since mechanical supporting or stability structure and passive component structures do not have to be produced separately.

In another embodiment, the first insulation layer is formed as a dielectric layer made of a material whose dielectric constant has a value of less than 4. By way of example, the dielectric constant of SiLK, an organic material, is 2.65. Other materials include, for example, coral or black diamond, which are carbon-doped oxides and have a dielectric constant of less than 3. The integrated electrically conductive structure used for mechanical stabilization may serve to prevent possible damage of even relatively low mechanical forces due to the small modulus and the low hardness of these materials. The first insulation layer may also be formed as a multilayer system in which the individual layers in some instances also have dielectric constants higher than 4. The multilayer system has an average dielectric constant whose value is less than 4, for example less than 3.

In another embodiment, the electrically conductive structure is essentially arranged vertically below a bonding region of the upper metal layer. The bonding region essentially denotes the region of the upper metal layer in which the electrical connections are arranged. The electrical connections include the contact wires for producing the electrical contact with the contact tracks of the housing. The bonding region can be realized in diverse ways. Directly arranging the electrically conductive structure below the bonding region enables an optimized mechanical stability. The dimensions of the electrically conductive structure in a plane parallel to the upper metal layer have at least the dimensions of the bonding region. Irrespective of where a bonding or an action of mechanical force acts on the bonding region, the first insulation layer or the entire electronic component can be protected from mechanical damage or destruction.

The electrically conductive structure in the first insulation layer can be arranged such that the electrically conductive structure is essentially flush with the horizontal planes of the first insulation layer. Consequently, the electrically conductive structure is formed in the first insulation layer such that partial regions of the horizontal surfaces of the first insulation layer are formed by surface regions of the electrically conductive structure. In this case, the electrically conductive structure is formed with maximal extent in the first insulation layer in the vertical direction (first insulation layer and electrically conductive structure have essentially identical dimensions in the vertical direction): The mechanical stability can be improved again as a result of this since there is no mechanically less stable or "softer" region of the first insulation layer below the bonding region which is not supported by the electrically conductive structure.

In another embodiment, the electrically conductive structure is connected to a supply voltage potential by means of via connections by means of a metal strip such as a contact metal strip formed in a further metallization plane and is connected to ground by means of via connections by means of a further metal strip formed in a metallization plane. Both contact strips may be formed in a second insulation layer which is produced from a material having a high mechanical stability in comparison with the mechanical stability of the material of the first insulation layer. The elastic modulus of the material of the second insulation layer, in one example, has a value of greater than 15 gigapascals or greater than 20 gigapascals, and a hardness of greater than 4. Alternatively, one or none of the contact strips may be formed in the second insulation layer. This is dependent on the geometry of the electrically conductive structure and the associated arrangement of the contact metal strips. Forming at least one metal strip—which enables the electrically conductive structure to be electrically contact-connected to voltage potentials—in a second insulation layer made of a material having high mechanical stability achieves additional stabilization of the electronic component under the action of mechanical force, in particular on the bonding region of the upper metal layer. An oxide layer or a layer made of FSG (fluorosilicate glass) dielectric may be formed as the second insulation layer.

An electrically conductive screening layer may also be formed between the upper metal layer and the electrically conductive structure. The electrically conductive screening layer is insulated both from the upper metal layer and from the electrically conductive structure. The screening layer may be formed as a metal layer which is connected to ground. In this case, the signals applied to the upper metal layer do not couple into the underlying electrically conductive structure and the signals applied to the electrically conductive structure or to the passive component do not couple into the upper metal layer.

The screening layer may be formed in a third insulation layer. The third insulation layer may be arranged between the upper metal layer and the first insulation layer. Forming the third insulation layer as an oxide layer makes it possible to obtain a further mechanical reinforcement of the first insulation layer. The screening layer may be formed as a contiguous plate or as a grid structure.

Effective electrical screening can be obtained when the screening layer is formed such that that the area of the screening layer which faces the electrically conductive structure is at least equal in magnitude to that area of the electrically conductive structure which faces the screening layer. The screening layer is formed on the electrically conductive structure such that, in the case of a plan view of the screening layer, the contour of the area of the screening layer covers the contour of the area of the electrically conductive structure.

The electrically conductive structure may be formed as a capacitance structure and/or as an inductance structure. In this case, the electrically conductive structure may be produced completely as a capacitance or completely as an inductance. However, the electrically conductive structure may also comprise a plurality of partial structures, one partial structure being arranged as a capacitance and a further partial structure being arranged as an inductance in the first insulation layer.

In one embodiment of the electrically conductive structure, at least one partial structure is formed as a capacitance structure, which extends over at least two metallization planes, and metal strips arranged parallel to one another and in a manner electrically insulated from one another are formed in each metallization plane. The metal strips of the first metallization plane are arranged essentially congruently with respect to the metal strips of the second metallization plane and are electrically connected to one another by via connections in the vertical direction.

In one embodiment, at least one partial structure of the electrically conductive structure is formed as an inductance structure and has at least one metallization plane in which a spiral metal track is formed.

The upper metal layer may be contact-connected by means of a contact hole in the second insulation layer to an electrically conductive region formed underneath, such as in the third insulation layer. The contact hole may be arranged in the region outside the bonding region of the upper metal layer and, in the same way as the electrically conductive region, may be arranged horizontally offset with respect to the electrically conductive structure.

In another embodiment, the electronic component is arranged on a substrate in an integrated circuit.

In a method for producing an electronic component, in a first insulation layer, an electrically conductive structure is formed as at least one passive electronic component and as a mechanical stabilization structure for supporting the first insulation layer under the action of mechanical force. An upper metal layer is produced on the first insulation layer. The upper metal layer is formed as an electrically conductive bonding pad layer, on which actions of mechanical force are exerted in particular during bonding or during mounting of the electronic component.

A structure having a dual function for the electronic component is thus produced in a simple manner exhibiting a low outlay. As a result, the electronic component can be realized in a space-saving manner and cost-effectively.

In one embodiment, the first insulation layer is formed from a material having a dielectric constant of less than 4, in one particular example, less than 3. A considerable improvement of the mechanical stability can thereby be achieved particularly in the case of such mechanically unstable and relatively sensitive materials with respect to the action of mechanical force.

The electrically conductive structure may be below a bonding region of the upper metal layer since, as a result of the mounting or the bonding of the electronic component particularly in the region below the bonding region, large mechanical forces take effect and may lead to damage and destruction.

The foregoing summary has been provided only by way of introduction. Nothing in this section should be taken as a limitation on the following claims, which define the scope of the invention.

BRIEF DESCRIPTION OF THE DRAWINGS

The invention will be explained in more detail in the following text using a number of exemplary embodiments and with reference to the drawings, in which.

In the figures, identical or functionally identical elements are provided with the same reference symbols.

DETAILED DESCRIPTION OF THE PREFERRED EMBODIMENTS

Figure 1:
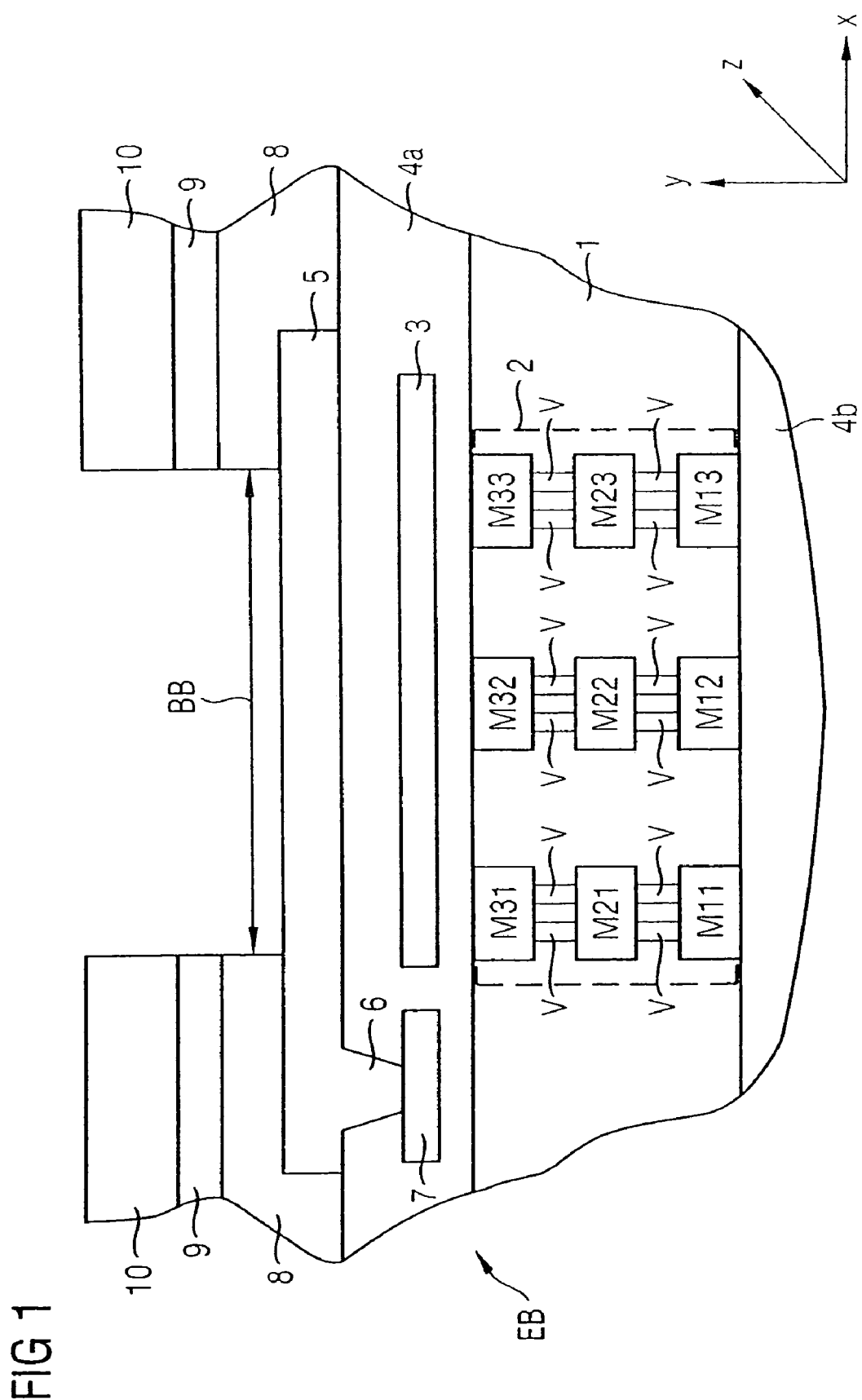
FIG. 1 shows a sectional illustration of an electronic component according to the invention.

An electronic component EB (FIG. 1) has a first insulation layer 1 is formed from a material having a low dielectric constant. An electrically conductive structure 2 is integrated in this first insulation layer 1. The electrically conductive structure 2 is formed as a capacitance structure and is constructed from the metal strips M11 to M33. The metal strips M11 to M33 extend in the z direction parallel to one another, the metal strips M11 to M13, the metal strips M21 to M23 and the metal strips M31 to M33 in each case being formed in a metallization plane. The metal strips M11, M21 and M31 are arranged congruently with respect to one another and are electrically connected to one another by means of via connections V. This also applies analogously to the metal strips M12, M22 and M32 and also M13, M23 and M33. The metal strips M11, M21 and M31 and also M13, M23 and M33 are connected to a supply voltage potential either a DC or an AC voltage. The metal strips M12, M22 and M32 are connected to ground. The capacitance structure is arranged in the first insulation layer 1 such that the metal strips M11, M12 and M13 terminate in a planar manner with the lower horizontal surface of the first insulation layer 1. Equally, the metal strips M31, M32 and M33 are embedded in the first insulation layer 1 with their surfaces such that they form a planar surface with the upper horizontal plane of the first insulation layer 1 in the x-z plane and essentially have the same height level. A further insulation layer 4b is arranged in a manner adjoining the first insulation layer 1 and is formed from a material having a high mechanical stability in comparison with the mechanical stability of the material of the first insulation layer 1. Components, for example transistors, are formed in the insulation layer 4b. The insulation layer 4b is formed on a substrate (not illustrated).

The structure 2 formed as a capacitance structure may also be formed in diverse ways in addition to the form illustrated. As further configuration possibilities, the structures in Aparicio, R. and Hajimiri, A.: Capacity Limits and Matching Properties of Integrated Capacitors; IEEE Journal of Solid-State Circuits, Vol. 37, No. 3, 2002, pp. 384–393, which are shown in perspective illustration in FIGS. 5 to 10, which is herein incorporated by reference, may be fabricated. The capacitance structure 2 may also be realized as a grid structure or as a MOS structure in a semiconductor component.

On the structure 2, an electrically conductive screening layer 3 is formed as a metal layer which is arranged in a third insulation layer 4a. The screening layer 3, formed as a plate, is arranged in the third insulation layer 4a such that the structure 2 is arranged completely below the screening layer 3. The third insulation layer 4a may be an oxide layer. An upper metal layer 5 is formed as a bonding pad layer on the third insulation layer 4a. The bonding pad layer 5 is connected to an electrically conductive region 7 by means of a contact hole 6 formed in the third insulation layer 4a. Both the contact hole 6 and the electrically conductive region 7 are arranged outside a bonding region BB of the bonding pad layer 5. In order to obtain an optimum mechanical reinforcement or stabilization of the first insulation layer 1 with regard to the actions of force that occur during bonding and/or during mounting of the electronic component EB in a housing, the structure 2 is essentially arranged below the bonding region BB. The bonding region BB is produced by removal, for example by exposure or etching, of the layer 10 formed on the bonding pad layer 5, and/or of the oxide and nitride layers 8 and 9. The layer 10 may be formed as a PSPI layer (Photo-Sensitive Polyamide layer).

The screening layer 3 is connected to ground, so that it is possible to prevent coupling of a signal present at the bonding pad layer 5 into the structure 2 or a coupling of a signal present at the structure 2 into the bonding pad layer 5.

If no screening layer 3 is formed as illustrated (FIG. 1), provision may also be made for forming the electrically conductive region 7 in that metallization plane in which the metal strips M31 to M33 are also arranged.

Figure 2:
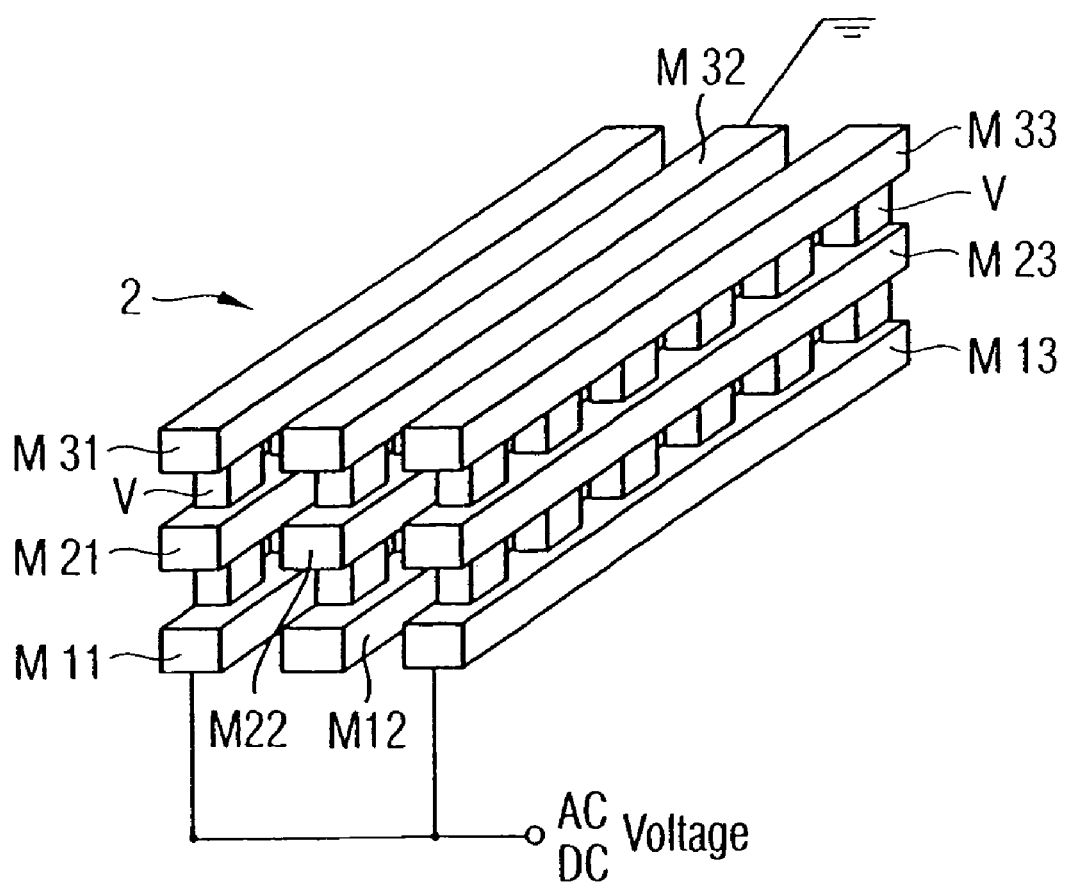
FIG. 2 shows a perspective illustration of a first exemplary embodiment of an electrically conductive structure of the electronic component according to the invention.
Figure 3:
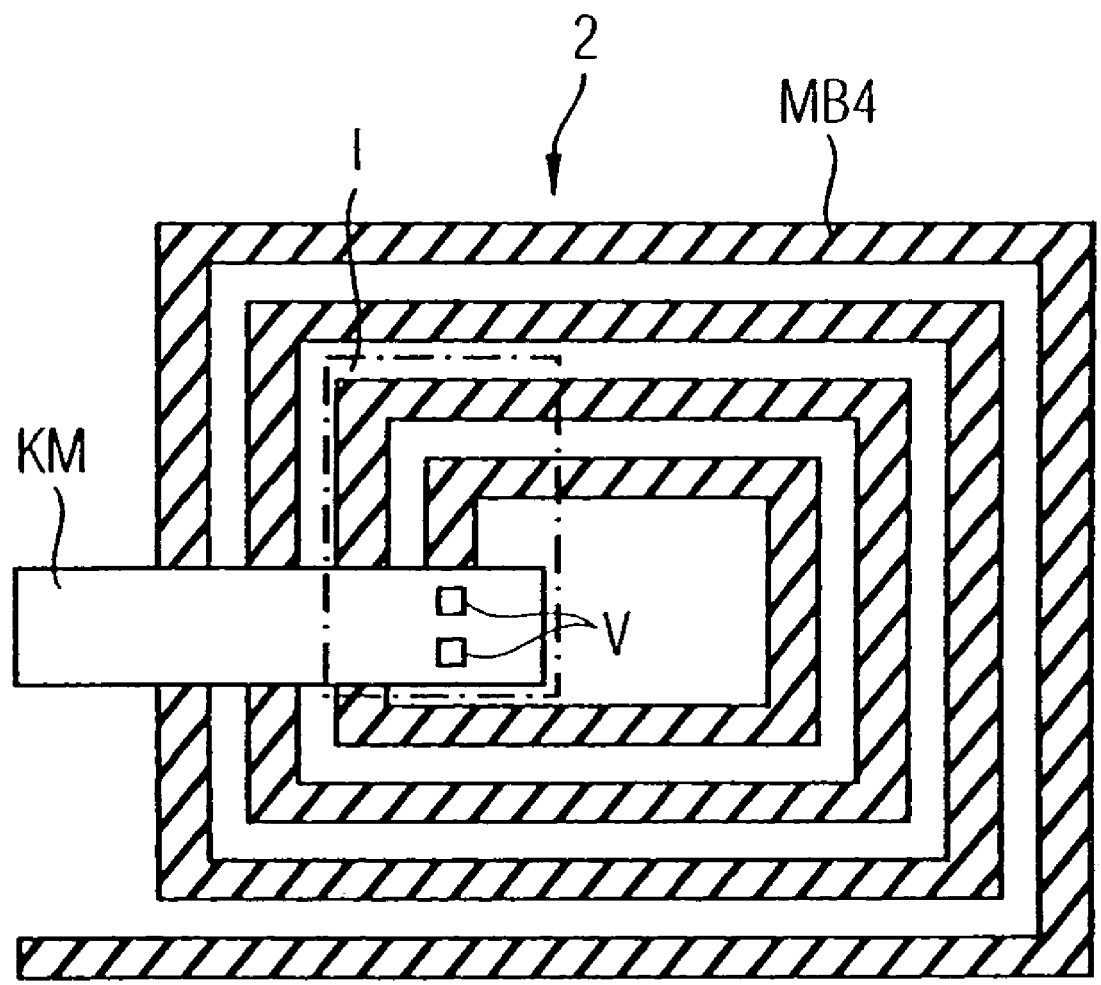
FIG. 3 shows a plan view of a second exemplary embodiment of an electrically conductive structure of the electronic component according to the invention.

FIG. 2 shows a perspective illustration of the capacitance structure 2, the metal strips M11, M21 and M31, the metal strips M12, M22 and M32 and also the metal strips M13, M23 and M33 being contact-connected by means of only one via connection V in each case, viewed in the y direction. The electrical connection of the metal strips M12, M22 and M32 to ground and the electrical connection of the metal strips M11, M21, M31, M13, M23 and M33 to supply voltage potential are effected by means of via connections and metal strips KM (as shown in FIG. 3). At least the metal strips KM may both be formed in a second insulation layer (not illustrated) which has a higher mechanical stability than the first insulation layer 1 (FIG. 1). The second insulation layer may be identical to the third insulation layer 4 illustrated in FIG. 1. The material of the second insulation layer has a higher mechanical stability than the material of the first insulation layer 1. The second insulation layer may be produced for example as an oxide layer or as a layer made of an FSG dielectric. However, it may also be the case that only one of the contact strips KM is formed in the second insulation layer. It is also possible to form the contact metal strips KM in the first insulation layer 1.

FIG. 3 illustrates a plan view (viewed in the negative y direction) of an electrically conductive structure 2 of an electronic component according to another embodiment of the invention. The electrically conductive structure 2 is formed as an inductance structure in this embodiment. A spiral metal track MB4 has a rectangular form and is formed in a single metallization plane. The metal track MB4 is integrated in the first insulation layer 1, which is not illustrated in FIG. 3. The inductance structure in the form of the spiral metal track MB4 may also be formed in a plurality of metallization planes, in which case, as in the capacitance structure in accordance with FIGS. 1 and 2, the entire metal track MB4 extends in the first insulation layer 1. At its inner end of the spiral, the metal track MB4 is contact-connected by means of via connections V to a contact metal strip KM connected to a supply voltage potential. The contact metal strip KM is produced in a higher metallization plane (viewed in the y direction corresponding to FIGS. 1, 2 and 4) than the metallization plane in which the metal track MB4 is formed, and is formed in the second insulation layer. In this case, a metallization plane arranged higher is to be understood as a metallization plane which is such that it is further away, viewed in the same direction, from a substrate of an integrated circuit—on which the electronic component EB according to the invention is arranged—than the metallization plane in which the electrically conductive structure 2 in the form of the capacitance structure and/or the inductance structure is formed. In this embodiment, too, the second insulation layer may be identical to the third insulation layer 4a illustrated in FIG. 1.

The outer second end of the spiral metal track MB4 is likewise electrically connected to ground by a via connection and a further contact metal strip KM. This further metal strip KM may be arranged in the first insulation layer 1 (FIG. 1) or the second insulation layer or a higher (viewed in the positive y direction) insulation layer that is possibly present.

The spiral metal track in accordance with FIG. 3 may also be made square, for example. Equally, the capacitance structure in accordance with FIG. 2, in the case of a plan view in the negative y direction, may have a rectangular or square contour, for example. The geometrical area configuration, in particular the contour and thus the dimensions of the electrically conductive structure, are chosen such that the area of the bonding region BB of the first metal layer 5, when projected onto the contour area of the electrically conductive structure, is completely contained in the said contour area of the electrically conductive structure.

Figure 4:
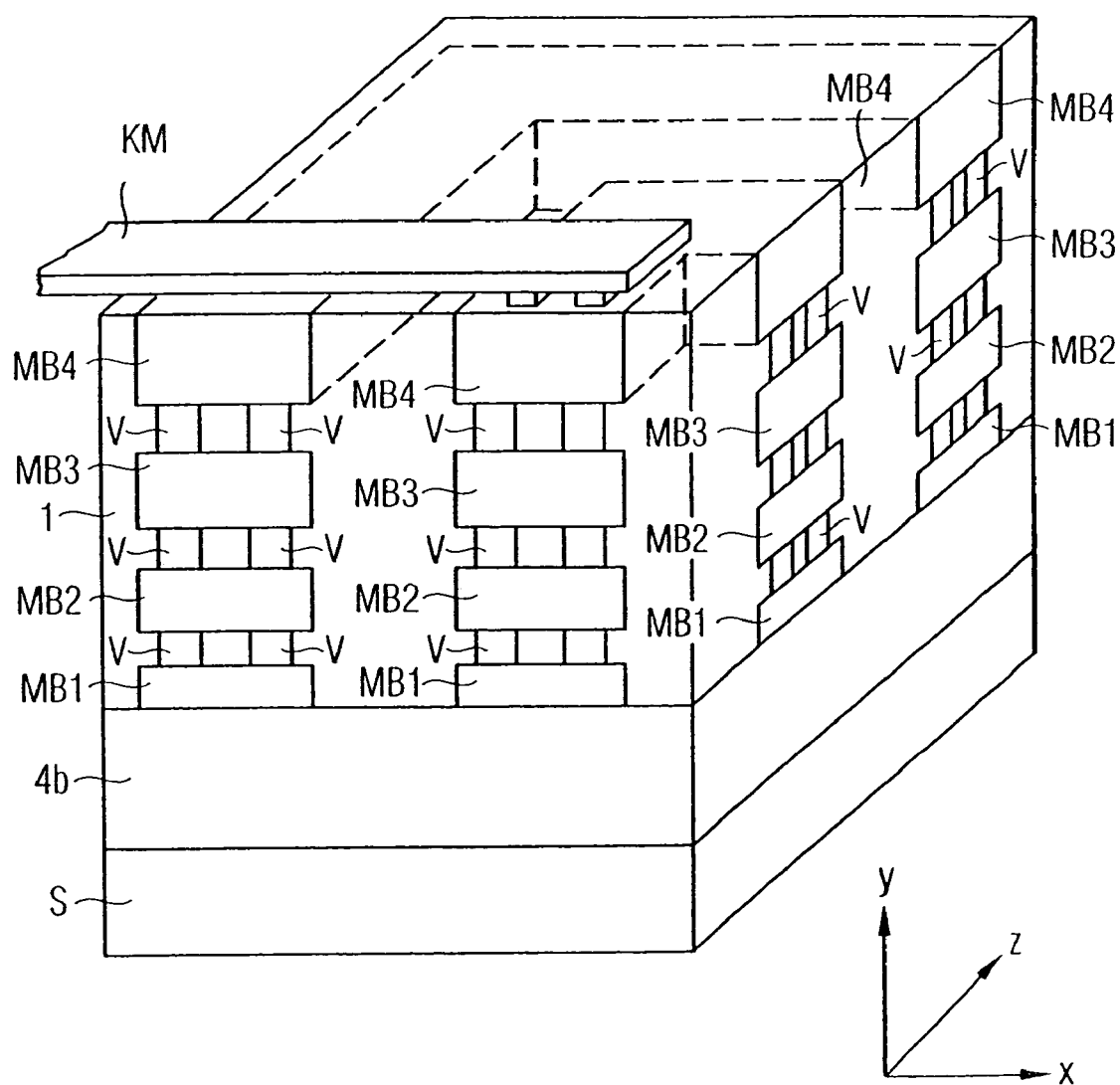
FIG. 4 shows a perspective illustration of a detail from the electrically conductive structure in accordance with FIG. 3.

FIG. 4 shows a perspective sectional illustration of the region I depicted in FIG. 3. In FIG. 4, an electrically conductive structure 2 formed as an inductance structure is integrated in the first insulation layer 1 and is formed in four metallization planes. One of the metal tracks MB1 to MB4 is in each case formed in the metallization planes, which metal tracks are electrically contact-connected to one another in each case by means of via connections V. The via connections may be formed as vertical pillars or as elongated strands running parallel to the metal tracks MB1 to MB4. On account of the so-called hierarchical interconnect technology, the metal tracks MB1 to MB4, with increasing distance (positive y direction) from the substrate S, may be formed with a larger cross section (x-y plane) and with an increasing distance (positive y direction) from one another. The second insulation layer (not illustrated), in which the contact metal strip KM is arranged, may be formed on the first insulation layer 1 in a directly adjoining manner. Layers 3 to 10 according to FIG. 1 may be arranged above that. As can be seen in FIG. 4, the inductance structure 2 in the form of the metal coils MB1 to MB4 is also formed such that the surface regions of the metal track MB4 and the surface regions of the metal track MB1 are formed in a planar manner (viewed in the x-z plane) with the surface of the first insulation layer 1. The course of the metal track MB4 within the first insulation layer 1 is illustrated by broken lines and by way of example for the course of the metal tracks MB1 to MB3. The first insulation layer 1 directly adjoins the insulation layer 4b, the insulation layer 4b being formed on the substrate S.

The electrically conductive structure 2 may also be formed such that it has a first partial structure corresponding to a capacitance structure in accordance with the exemplary embodiment in FIG. 1 or 2 and a second partial structure corresponding to an inductance structure in accordance with the exemplary embodiment in FIG. 3 or 4. In this case, a mechanical stabilization structure and two passive electronic components can be realized with the electrically conductive structure. The partial structures may be arranged one beside the other or one above the other.

The electrically conductive structure may be realized in diverse ways and is not restricted to the embodiments shown. Thus, the electrically conductive structure may also be formed in two or more than four metallization planes. Equally, the insulation layers may be constructed from a plurality of layers in each case. The capacitance structure in accordance with FIGS. 1 and 2 may also be formed only in one metallization plane and, for example, for producing only the metal strips M11, M12 and M13.

By means of the electronic component and the method for producing the electronic component it is possible, by means of the suitable formation (shaping) and arrangement of a single electrically conductive structure formed in an insulation layer such as a dielectric layer made of a material having a low dielectric constant, to produce both a passive component and a mechanical supporting or stabilization structure for the electronic component EB. The insulation layer in which the electrically conductive structure is formed may be protected against damage under the action of mechanical force, for example during bonding or mounting of the component in a housing. As a result, optimum utilization is made of the region under the bonding pad layer, thus resulting in a component topology with minimized dimensions and optimized functional utilization.

Thus, the electrically conductive structure has a dual function on the one hand in the form of at least one passive electronic component and on the other hand as a mechanical stabilization structure for the electronic component EB and in particular for the first insulation layer.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:
1. An electronic component comprising:
a first insulation layer;
an upper metal layer formed on the first insulation layer;
an electrically conductive structure integrated into the first insulation layer, the electrically conductive structure mechanically stabilizing the insulation layer under the action of mechanical force, the electrically conductive structure formed as a capacitor structure in which a first strip sequence of metal strips arranged congruently one above another and connected to one another by via connections are connected to a first electrical potential; and
a second strip sequence of metal strips that are arranged congruently one above another and are connected to one another by via connections is in each case arranged on both sides of the first strip sequence at identical lateral distances, the metal strips of the second strip sequences in each case being arranged at the same level as the metal strips of the first strip sequence and being connected to a second electrical potential.

2. The electronic component according to claim 1, wherein the electrically conductive structure is planar with horizontal surfaces of the first insulation layer and surface regions of the conductive structure form partial regions of the horizontal surfaces of the first insulation layer.

3. An integrated circuit having a substrate and an electronic component according to claim 1, wherein the electronic component is formed on the substrate.

4. The electronic component according to claim 1, wherein the upper metal layer is an electrically conductive bonding pad layer.

5. The electronic component according to claim 1, wherein the electrically conductive structure is sufficient to stabilize the insulation layer during at least one of: bonding of the upper metal layer or mounting of the electronic component.

6. The electronic component according to claim 1, wherein the first insulation layer is formed from a material having a dielectric constant of less than 4.

7. The electronic component according to claim 1, wherein the upper metal layer has a bonding region and the electrically conductive structure is essentially arranged vertically below the bonding region.

8. The electronic component according to claim 7, wherein dimensions of the electrically conductive structure in a plane parallel to the upper metal layer are identical in magnitude to the bonding region.

9. The electronic component according to claim 1, wherein an electrically conductive screening layer is formed between and electrically insulated from the upper metal layer and the electrically conductive structure.

10. The electronic component according to claim 9, wherein the screening layer is a second metal layer and is connected to ground.

11. The electronic component according to claim 9, wherein the screening layer is formed as a contiguous plate or as a grid structure.

12. The electronic component according to claim 9, wherein an area of the screening layer which faces the electrically conductive structure is identical in magnitude to an area of the conductive structure which faces the screening layer, and is arranged such that when the areas are projected on one another, the area of the screening layer completely covers the area of the conductive structure.

13. The electronic component according to claim 9, wherein the screening layer is formed in a second insulation layer, the second insulation layer arranged between the first insulation layer and the upper metal layer.

14. The electronic component according to claim 13, wherein the upper metal layer is electrically connected to an electrically conductive region by means of a contact region in a third insulation layer, the electrically conductive region being arranged in the second or third insulation layer.

15. The electronic component according to claim 14, wherein the contact region and the second electrically conductive region are arranged horizontally offset with respect to the electrically conductive structure and with respect to a bonding region of the upper metal layer.

16. The electronic component comprising:
a first insulation layer;
an electrically conductive structure formed as a passive electronic component and integrated into the first insulation layer, the electrically conductive structure mechanically stabilizing the insulation layer under the action of mechanical force;
a second insulation layer applied on the first insulation layer, the second insulation layer containing a metallic screening layer arranged vertically above the electrically conductive structure such that the second insulation layer laterally completely covers the electrically conductive structure;
an upper metal layer formed on the second insulation layer; and
an electrically conductive region arranged laterally with respect to the screening layer in the same plane as the screening layer within the second insulation layer, the electrically conductive region connected, by means of a contact hole in the second insulation layer, to the upper metal layer applied on the second insulation layer.

17. The electronic component according to claim 16, wherein the electrically conductive structure is electrically connected to a supply voltage potential and ground, respectively, by means of via connections and electrical contact strips.

18. The electronic component according to claim 16, wherein the first insulation layer is formed from a material having a dielectric constant of less than 4.

19. The electronic component according to claim 16, wherein the electrically conductive structure is planar with horizontal surfaces of the first insulation layer and surface regions of the conductive structure form partial regions of the horizontal surfaces of the first insulation layer.

20. An integrated circuit having a substrate and an electronic component according to claim 16, wherein the electronic component is formed on the substrate.

21. The electronic component according to claim 16, wherein the upper metal layer is an electrically conductive bonding pad layer.

22. The electronic component according to claim 16, wherein the electrically conductive structure is sufficient to stabilize the insulation layer during at least one of: bonding of the upper metal layer or mounting of the electronic component.

23. The electronic component according to claim 16, wherein the upper metal layer has a bonding region and the electrically conductive structure is essentially arranged vertically below the bonding region.

24. The electronic component according to claim 23, wherein dimensions of the electrically conductive structure in a plane parallel to the upper metal layer are identical in magnitude to the bonding region.

25. The electronic component according to claim 16, wherein the electrically conductive structure is formed at least one of: as a capacitance structure or as an inductance structure.

26. The electronic component according to claim 25, wherein a partial region of the electrically conductive structure is formed as a capacitance structure and has at least two metallization planes, strips arranged parallel to one another and insulated from one another being formed in the first metallization plane, the strips are arranged congruently with respect to the strips arranged parallel to one another and insulated from one another in the second metallization plane and the strips arranged one above another in a vertical direction in the two metallization planes being electrically connected by via connections.

27. The electronic component according to claim 25, wherein a partial region of the electrically conductive structure is formed as an inductance structure and has at least one metallization plane in which a spiral metal track is formed.

* * * * *

UNITED STATES PATENT AND TRADEMARK OFFICE
CERTIFICATE OF CORRECTION

PATENT NO.        : 7,193,263 B2                                      Page 1 of 1
APPLICATION NO.   : 11/109405
DATED             : March 20, 2007
INVENTOR(S)       : Hans-Joachim Barth It is certified that error appears in the above-identified patent and that said Letters Patent is hereby corrected as shown below:

On the Title Page, Item [30]

In column 1, line 1, under "Foreign Application Priority Data", delete "102 49 192" and substitute --102 49 192.5-- in its place.

Signed and Sealed this

Twelfth Day of June, 2007

JON W. DUDAS
*Director of the United States Patent and Trademark Office*